United States Patent [19]

Pearce

[11] Patent Number: 5,689,129
[45] Date of Patent: Nov. 18, 1997

[54] HIGH EFFICIENCY POWER MOS SWITCH

[75] Inventor: Lawrence George Pearce, Palm Bay, Fla.

[73] Assignee: Harris Corporation, Palm Bay, Fla.

[21] Appl. No.: 483,691

[22] Filed: Jun. 7, 1995

[51] Int. Cl.⁶ .......................... H01L 29/76; H01L 29/94
[52] U.S. Cl. .................. 257/341; 257/342; 257/343
[58] Field of Search ......................... 257/342, 343, 257/341

[56] References Cited

U.S. PATENT DOCUMENTS

| | | |
|---|---|---|
| 4,313,126 | 1/1982 | Krumm et al. . |
| 4,554,512 | 11/1985 | Aiello . |
| 5,136,349 | 8/1992 | Yilmaz et al. .................. 257/341 |
| 5,256,893 | 10/1993 | Yasuoka . |
| 5,302,845 | 4/1994 | Kumagai et al. ............ 257/327 |
| 5,355,008 | 10/1994 | Moyer et al. ................ 257/341 |
| 5,387,875 | 2/1995 | Tateno . |

FOREIGN PATENT DOCUMENTS

| | | |
|---|---|---|
| 0 525 777 A1 | 2/1993 | European Pat. Off. . |
| 0557 253 | 8/1993 | European Pat. Off. . |
| 0 655 830 A1 | 5/1995 | European Pat. Off. . |
| 2 263 091 | 7/1973 | Germany ................. 257/341 |
| 42 09 148 | 10/1992 | Germany . |
| 63-262873 | 10/1988 | Japan ..................... 257/342 |
| 4-165678 | 6/1992 | Japan ..................... 257/342 |
| 5267675 | 10/1993 | Japan . |

OTHER PUBLICATIONS

A. Watson Swager, "Power ICs Weighing The Benefits Of Integration", EDN–Electrical Design News, vol. 39, No. 14, Newton, MA, Jul. 1994, pp. 68–72, 74, 76, 78, 80, 82.

Primary Examiner—Mahshid D. Saadat
Assistant Examiner—Valencia Martin Wallace
Attorney, Agent, or Firm—Jaeckle Fleischmann & Mugel, LLP

[57] ABSTRACT

A power MOS switch (40) is an array of MOS devices that includes alternating drain columns and source columns. Each drain column includes a plurality of separate drain regions (300) that are closely spaced one from another, and each source column includes a continuous narrow elongated source distribution region (302) that extends the length of the column. A plurality of narrow source distribution branch regions (302) are connected to the elongated region and extend transversely from the elongated region at least partially between each separate drain region in each drain column adjacent to the source column. A gate region (303) separates the drain regions in each column from the adjacent source distribution regions.

15 Claims, 1 Drawing Sheet

HIGH EFFICIENCY POWER MOS SWITCH

FIELD OF THE INVENTION

The present invention relates to electronic semiconductor devices, and more particularly to an MOS power switch of increased efficiency.

BACKGROUND OF THE INVENTION

MOS integrated circuits used in power control applications, such as switching power supplies and small motor or actuator drivers, put high demands on the area efficiency of the MOS switches. As a result of these demands, the design of power MOS switches with low resistance becomes crucial to the price competitiveness of an MOS process.

Increasing the specific channel width density of an MOS transistor array would lead to improved efficiency of the device. It would be desirable to take advantage of low resistance in the source-drain regions of a transistor by modifying the configuration of the array to substantially increase its specific channel width density. The present invention achieves this desirable result.

SUMMARY OF THE INVENTION

In accordance with the invention, a power MOS switch comprises an array of MOS devices that comprise alternating drain columns and source columns. Each drain column comprises a plurality of separate drain regions that are closely spaced one from another, and each source column comprises a continuous narrow elongated source distribution region that extends the length of the column. A plurality of narrow source distribution branch regions are connected to the elongated region and extend transversely from the elongated region at least partially between each separate drain region in each drain column adjacent to the source column. A gate region separates the drain regions in each column from the adjacent source distribution regions.

Also in accordance with the invention, the gate region comprises doped silicon, preferably a self-aligned metal silicide layer. Most preferably, the metal silicide is platinum silicide.

The power MOS switch of the invention further comprises a drain contact situated within each drain region and a source contact situated in each of the areas of intersection of the narrow elongated source distribution region with the transverse narrow branch regions. This configuration serves to minimize cell area while maximizing specific channel width.

DETAILED DESCRIPTION

Figure 1:
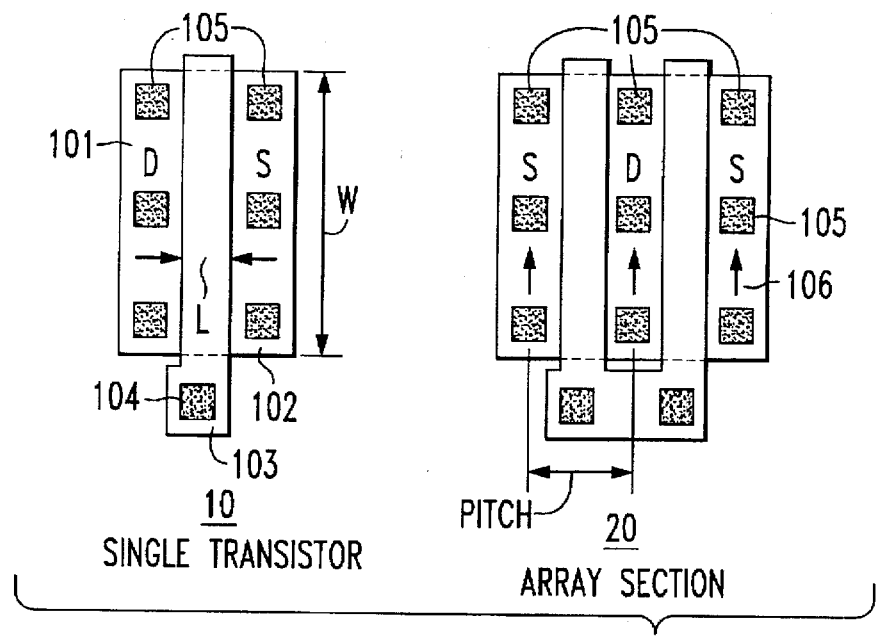
FIG. 1 is a schematic diagram of a prior art linear gate MOS transistor array.

Power MOS switches are often constructed as large arrays of a standard linear gate MOS transistor configuration. FIG. 1 schematically depicts a single transistor 10 comprising a drain region 101 and a source region 102 separated by a gate region 103 having a contact 104. Both the drain and source regions are provided with contacts 105.

Also shown in FIG. 1 is an array 20 of linear gate MOS transistors. In this approach to switch design, the effective width W of the transistor is scaled up to give the conduction required. The specific channel width (W/total device area) is then set by the minimum drain-to-source pitch that can be achieved by the process. Typically this is limited by the gate length L, the contact size, and the necessary spacing of contact to gate polysilicon. In such an array the metal routing, represented by the bold arrows 105 in FIG. 1, to the source and drain is typically parallel to the gate polysilicon. This allows contact spacing to be very tight, thereby contributing negligible source or drain distribution resistance to the device. For an optimum device of this linear design, the metal routing pitch equals the source-drain pitch; this is important, given the great impact of the metal routing configuration on the achievable conductance and yield of a large area MOS switch.

Figure 2:
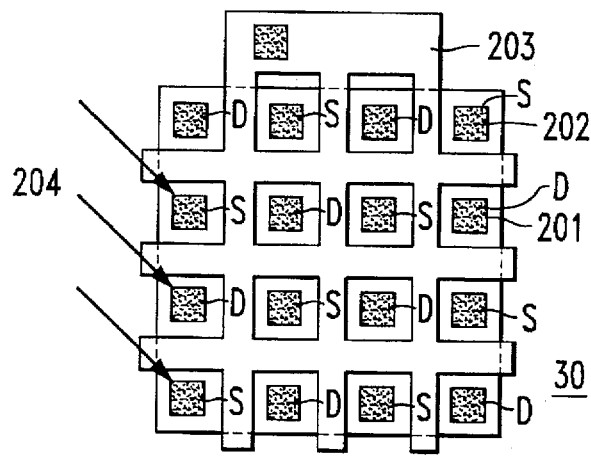
FIG. 2 is a schematic diagram of a prior art "checker board" transistor array.

One frequently employed improvement on the standard linear gate layout of a power MOS transistor is a "checker board" arrangement 30, shown schematically in FIG. 2, in which the drain and source regions, and their contacts 201 and 202, respectively, alternate with one another in both the rows and columns of the array. Again, the source and drain regions are separated by gate region 203. Depending upon the relative values of channel length, contact size, and contact to polysilicon spacing, this approach may be effective at increasing the specific channel width of the layout. In this configuration, the metal routing required is along the diagonals, represented by the series of arrows 204, connecting the drain windows and the source windows. Assuming the same dimensional constraints as for the linear gate array of FIG. 1, the metal routing pitch is 0.707 (inverse of square root of 2) times the source-drain pitch. Thus, although the specific channel width may be improved by the "checker board" pattern, the metal routing constraints would be aggravated.

In some cases the "checker board" layout of FIG. 2 is complicated by differing spacing requirements for drain-polysilicon and source-polysilicon contacts. This is usually the case for extended drain transistor designs, where the "checker board" square dimension is set by the larger spacing of the drain, resulting in wasted area in the oversized source windows. This situation may completely negate the gains anticipated from the "checker board" pattern.

Figure 3:
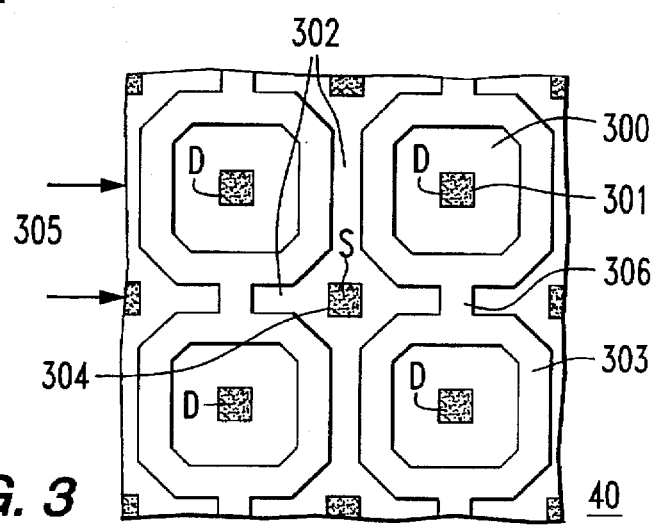
FIG. 3 is a schematic diagram of a power MOS switch of the present invention.

The power MOS switch 40 of the present invention, whose configuration is depicted in FIG. 3, is characterized by substantially increased specific channel width compared with the arrangements of the prior art. In accordance with the invention, the size of the areas enclosed by gate polysilicon around each drain or source contact is determined by the contact to polysilicon spacing, even in the case of unequal source and drain size requirements. The shape of the cells in the drain column, as shown in FIG. 3, is essentially square; however process factors such as metal pitch requirements may require rectangular designs. The drain regions 300 in one column, each including a contact 301, are closely spaced to those in adjacent columns, each column being separated from the adjacent one by a narrow elongated source distribution region 302. Also within a column, the drain regions are closely spaced, being separated from one another at least partially by transverse branches of the elongated source distribution regions 302. Each drain region is separated from the adjacent source distribution region by ring-shaped gate region 303. Provision is made for source contacts 304 in those areas of the elongated source distribution regions where they intersect the transverse branches. This configuration serves to minimize cell area while maximizing specific channel width and also simplifies the metal routing arrangement, represented by the arrows 305.

The source distribution regions place a significant resistance component in series with the channel conductance, the result of the distributed resistance of the source region between the contact and the active gate edge. It is therefore desirable to keep this source resistance as low as possible relative to the channel conductance. This objective may be achieved by employing a self-aligned silicide layer for the gate, drain, and source regions. The silicide is formed preferably from the reaction of silicon with platinum; however metals such as titanium, cobalt, and tungsten may also be used.

In accordance with the invention, the source distribution regions of the switch may be totally interconnected. However this would leave the gate polysilicon encompassing each drain area isolated and would require individual contacting of each gate ring 303. To enable remote contacting of the gate rings 303, small connecting polysilicon bridges 306 between the rings, as depicted in FIG. 3, are provided.

The switch configuration provides substantial benefits. The metal routing pitch allowed by this layout is larger than the "checker board" arrangement for the same dimensional constraints. In addition, all the drain regions are almost fully bounded by an active gate so that there is no gate width termination region. Thus, the switch configuration of the present invention provides increased specific channel width (W/area), wider metal routing channels, and reentrant drain design, which may result in substantial yield advantages.

The invention has been described in detail with particular reference to preferred embodiments thereof, but it will be understood that variations and modifications can be effected within the spirit and scope of the invention.

What is claimed is:

1. A power MOS switch comprising:

an array of repeating alternating drain columns and source columns;

each drain column being closely spaced one from another and comprising a plurality of separate drain regions closely spaced one from another;

each source column comprising a continuous narrow elongated source distribution region extending the length of the column and a plurality of narrow source distribution branch regions intersecting and connected to said continuous narrow elongated source distribution region and extending transversely from said continuous narrow elongated source distribution region at least partially between each separate drain region in each drain column adjacent to said source column, said source distribution regions being narrower than each said separate drain region; and a gate region separating the drain regions in each said drain column from the adjacent source distribution regions.

2. The power MOS switch of claim 1 wherein said gate region comprises doped polysilicon.

3. The power MOS switch of claim 2 wherein said gate region further comprises a self-aligned silicide layer.

4. The power MOS switch of claim 3 wherein said silicide layer comprises a silicide of a metal selected from the group consisting of platinum, titanium, cobalt, and tungsten.

5. The power MOS switch of claim 4 wherein said metal is platinum.

6. The power MOS switch of claim 1 wherein each source distribution region in each source column is interconnected with every other source distribution region in every other source column.

7. The power MOS switch of claim 1 wherein each said drain region in each said drain column is encompassed by a portion of said gate region.

8. The power MOS switch of claim 7 wherein said portion of said gate region encompassing each said drain region in each said drain column is connected to each adjacent portion of said gate region in each said drain column by a polysilicon bridge.

9. The power MOS switch of claim 8 wherein each said polysilicon bridge further comprises a self-aligned metal silicide layer.

10. The power MOS switch of claim 1 further comprising a drain contact situated within each drain region.

11. The power MOS switch of claim 10 further comprising a source contact situated in each of the areas of intersection of said elongated source distribution regions with said branch regions.

12. The power MOS switch of claim 1 wherein the drain regions have a silicide layer.

13. The power MOS switch of claim 12 wherein the silicide layer comprises a silicide selected from the group consisting of platinum, titanium, cobalt, and tungsten.

14. The power MOS switch of claim 1 wherein said elongated source distribution regions and said source distribution branch regions include a silicide layer.

15. The power MOS switch of claim 14 wherein the silicide layer comprises a silicide selected from the group consisting of platinum, titanium, cobalt, and tungsten.

* * * * *